(12) United States Patent
Weihua et al.

(10) Patent No.: US 8,815,699 B2
(45) Date of Patent: Aug. 26, 2014

(54) FABRICATION OF REVERSE SHALLOW TRENCH ISOLATION STRUCTURES WITH SUPER-STEEP RETROGRADE WELLS

(71) Applicant: GLOBALFOUNDRIES Inc., Grand Cayman, KY (US)

(72) Inventors: Tong Weihua, Clifton Park, NY (US); Krishnan Bharat, Clifton Park, NY (US); Lun Zhao, Ballston Lake, NY (US); Kim Seung, North Andover, MA (US); Lee Yongmeng, Mechanicsville, NY (US); Kim Sun, Ballston Spa, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/670,566

(22) Filed: Nov. 7, 2012

(65) Prior Publication Data

US 2014/0124794 A1    May 8, 2014

(51) Int. Cl.
   *H01L 21/76*    (2006.01)
(52) U.S. Cl.
   USPC ........... 438/400; 438/770; 438/787; 438/431; 257/E21.082; 257/E21.545
(58) Field of Classification Search
   USPC ......... 438/770, 773, 787, 400, 425, 431, 439; 257/E21.082, E21.284, E21.54, 257/E21.545
   See application file for complete search history.

(56) References Cited

U.S. PATENT DOCUMENTS

| | | | |
|---|---|---|---|
| 5,384,473 A * | 1/1995 | Yoshikawa et al. | 257/255 |
| 6,306,722 B1 | 10/2001 | Yang et al. | |
| 6,362,510 B1 * | 3/2002 | Gardner et al. | 257/374 |
| 6,921,705 B2 | 7/2005 | Choi et al. | |
| 6,972,478 B1 * | 12/2005 | Waite et al. | 257/627 |
| 7,002,214 B1 | 2/2006 | Boyd et al. | |
| 2006/0244097 A1 * | 11/2006 | Wasshuber | 257/510 |
| 2009/0108350 A1 | 4/2009 | Cai et al. | |
| 2009/0130805 A1 | 5/2009 | Babcock et al. | |
| 2011/0237035 A1 * | 9/2011 | Yan et al. | 438/197 |

* cited by examiner

*Primary Examiner* — Julia Slutsker
(74) *Attorney, Agent, or Firm* — Amerson Law Firm, PLLC

(57) ABSTRACT

Generally, the present disclosure is directed to methods for forming reverse shallow trench isolation structures with super-steep retrograde wells for use with field effect transistor elements. One illustrative method disclosed herein includes performing a thermal oxidation process to form a layer of thermal oxide material on a semiconductor layer of a semiconductor substrate, and forming a plurality of openings in the layer of thermal oxide material to form a plurality of isolation regions from the layer of thermal oxide material, wherein each of the plurality of openings exposes a respective surface region of the semiconductor layer.

19 Claims, 11 Drawing Sheets

FABRICATION OF REVERSE SHALLOW TRENCH ISOLATION STRUCTURES WITH SUPER-STEEP RETROGRADE WELLS

BACKGROUND OF THE INVENTION

1. Field of the Invention

Generally, the present invention relates to sophisticated integrated circuits, and, more particularly, to methods of forming reverse shallow trench isolation structures with super-steep retrograde wells for use with field effect transistor elements.

2. Description of the Related Art

In modern ultra-high density integrated circuits, device features have been steadily decreasing in size to enhance the performance of the semiconductor device and the overall functionality of the circuit. In addition to an increase in the speed of operation due to reduced signal propagation times, reduced feature sizes allow an increase in the number of functional elements in the circuit in order to extend its functionality. Today, advanced semiconductor devices may include features having critical sizes of 32 nm or even less, and the development of technology nodes based on device critical size dimensions of 22 nm, 14 nm and even smaller is ongoing.

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most common approach, due to the superior characteristics in view of operating speed and/or power consumption. During the fabrication of complex integrated circuits using CMOS technology, millions of complementary transistors, i.e., N-channel (NMOS) transistors and P-channel (PMOS) transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode formed above the channel region and separated from the channel by a thin gate insulating layer, or gate dielectric. In operation, an appropriate control voltage is applied to the gate electrode, which thereby forms a conductive channel below the gate electrode.

The conductivity of the channel region depends on several factors, including dopant concentration, the mobility of the charge carriers, and, for a given extension of the channel region in the transistor width direction, on the distance between the source and drain regions, which is also referred to as channel length. Of these factors, the channel length is a primary and important contributing factor in overall device speed, and as such, a reduction of the channel length, i.e., the critical size, of transistors has been a major focus in ongoing device development and improvement. However, the continuous shrinkage of the transistor dimensions carries with it a plurality of issues which have to be addressed so as to not unduly offset the advantages that may be obtained by steadily decreasing the channel length of MOS transistors, such as the development of enhanced photolithography and etch strategies necessary to reliably and reproducibly create circuit elements having very small critical dimensions for new device generations.

In most modern semiconductor devices, and in particular, those based on CMOS technology, the various device regions, which often include one or more circuit elements, are electrically separated by electrical isolation structures, sometimes in the form of shallow trench isolation (STI) structures. It should be appreciated that, as the critical sizes of circuit elements decreases, the dimensions of the device regions may also decrease, as well as the critical sizes of the isolation structures separating those device regions, so that the overriding benefits of increased device density may be realized. However, decreasing the critical size of an isolation structure, such as an STI, can sometimes lead to a variety of device processing and reliability issues.

For example, in many device applications, such as those based on a critical size of 32 nm and smaller, the depth of a typical STI often ranges from 200-300 nm, whereas the width is generally on the order of 40-60 nm or even less. Accordingly, the aspect ratio (i.e., the depth-to-width ratio) of the trench opening in which the STI is formed may be at least approximately 6:1, and in some applications may range as high as approximately 10:1. Properly filling such a narrow-gap high aspect ratio trench opening without creating voids can be problematic. Furthermore, the typical gap-fill material deposition processes that are most often used to fill such high aspect ratio openings often form a deposited material that is substantially more susceptible to etch attack during the plurality of etching and cleaning steps to which the device may be exposed during subsequent processing sequences. FIGS. 1A-1F schematically illustrate a conventional prior art integration scheme that has been used for forming shallow trench isolation structures of a semiconductor device wherein one or more of the above-described problems may arise, and which will be described in further detail below.

FIG. 1A schematically illustrates a semiconductor device 100 in very early stage of device manufacture. The semiconductor device 100 includes a substrate 101, which may represent any appropriate carrier material for having formed thereon or thereabove a semiconductor layer 102. In the manufacturing stage shown in FIG. 1A, a thin silicon dioxide material layer 103, sometimes referred to as a pad oxide layer 103, has been formed on the semiconductor layer 102, and a silicon nitride material layer 104, sometimes referred to as a pad nitride layer 104, has been formed on the pad oxide layer 103. Additionally, a resist layer 105 has been formed above the pad nitride layer 104 and patterned using photolithography techniques well known in the art to form openings 105a in the resist layer 105, each of which correspond to respective locations and sizes of the shallow trench isolation (STI) structures that will be formed in the semiconductor layer 102 during succeeding processing steps, as discussed below.

After the openings 105a have been formed in the resist layer 105, a suitable anisotropic etch process 106, such as a reactive ion etch process and the like, is performed using the patterned resist layer 105 as an etch mask, as shown in FIG. 1B. During the etch process 106, the openings 105a are extended through the pad nitride layer 104, through the pad oxide layer 103, and into the semiconductor layer 102, thereby forming the trench openings 102a in the layer 102. In some cases, the depth of the trench openings 102a is established based on the duration of the etch process 106. In other cases, such as where devices are formed on so-called silicon-on-insulator (SOI) substrates, the depth of the trench openings is established based upon the position of a buried insulation layer (not shown) on which the semiconductor layer 102 is formed, which may be used as an etch stop layer during the etch process 106.

Next, as shown in FIG. 1C, the resist layer 105 is removed from above the pad nitride layer 104 and a thermal oxidation process 107 is performed so as to form an oxide liner 108 on the exposed surfaces (i.e., sidewalls and bottom) of each of the trench openings 102a. The oxide liner 108 generally improves the adherence of the subsequently deposited oxide material layer 110 that is used to form each of the STI structures 110i (see, FIGS. 1D-1F).

FIG. 1D schematically illustrates the semiconductor device 100 of FIG. 1C during a subsequent deposition process 109, during which the oxide material layer 110 is formed above the device 100 so as to overfill each of the lined trench openings 102a and cover the pad nitride layer 104. Thereafter, as shown in FIG. 1E, a planarization process 111, such as a chemical mechanical polishing (CMP) process, is performed on the oxide material layer 110 using the pad nitride layer 104 as a CMP stop layer, so that the oxide material layer 110 is removed from above the pad nitride layer 104.

FIG. 1F shows the semiconductor device 100 after a suitable etch process 112, such as a wet etch process based on phosphoric acid and the like, has been performed so as to selectively remove the remaining portions of the pad nitride layer 104, thus forming the STI structures 110i. Furthermore, as shown in FIG. 1F, the STI structures 110i are positioned in the semiconductor layer 102 so as to separate the semiconductor layer 102 into various device active regions, such as the active regions 122A and 122B. Depending on the desired device conductivity in each of the active regions 122A and 122B, specific dopant types may be introduced into the respective active regions 122A and 122B after the STI structures 110i have been formed, or dopants may be present in the semiconductor layer 102 prior to the above-described steps, such that the active regions 122A, 122B form either an n-well (i.e., where PMOS devices are formed) or a p-well (i.e., where NMOS devices are formed).

As noted previously, the aspect ratios of the STI trenches 102a may be relatively high, e.g., greater than about a 6:1 depth-to-width ratio. Accordingly, the deposition process 109 that is used to form the material 110 in each of the trench openings 102a must generally have very good gap-fill capabilities, so that the inclusion of any void regions in the STI structures 110i can be substantially avoided. In some applications, the deposition process 109 is a high density plasma (HDP) oxide deposition process—sometimes referred to as an HDP oxide process—which is a specialized chemical vapor deposition (CVD) process that has been shown to provide relatively good gap-fill capabilities for aspect ratios up to approximately 7:1 and higher. In other applications, such as when the aspect ratio of the trench openings 102a exceeds 8:1 or even 10:1, the deposition process 109 may be a high aspect ratio process (HARP) or enhanced high aspect ratio process (eHARP), which are specialized sub-atmospheric chemical vapor deposition (SACVD) processes based on tetraethyl orthosilicate (TEOS) and ozone.

It should be appreciated that, during subsequent device processing steps, the shallow trench isolation structures 110i may be exposed to various etch and/or cleaning recipes, all of which may potentially attack the oxide material formed in the trench openings 102a using one of the high gap-fill HDP oxide or HARP/eHARP oxide CVD deposition processes. Furthermore, it is well understood that the oxide materials that are deposited using these high-gap fill processes generally exhibit a significantly higher etch rate when exposed to the various wet etch recipes that may be utilized during device processing than does a corresponding thermally grown oxide material. Accordingly, in some applications, the oxide material layer 110 is sometimes exposed to a thermal annealing step prior to performing the planarization process 111 so as to increase the etch resistance of the deposited oxide material 110, a step that is sometimes referred to as a "densification" process. However, while such densification processes may tend to increase the etch resistance of the as-deposited oxide material layer 110 to a greater or lesser degree (for example, depending on the specific process parameters), the resulting wet etch rate of such high gap-fill deposited oxide materials 110 is typically somewhere in the range of approximately 1.5 to 7 times greater than that of a thermal oxide material. Accordingly, some processing defects can occur during later manufacturing stages, as will be further described with respect to FIGS. 1G-1I below.

FIG. 1G is transmission electron microscopy (TEM) photograph showing a representative semiconductor device 170 which utilizes a typical shallow trench isolation structure configuration that is formed using a conventional prior art manufacturing process flow. As shown in FIG. 1G, a typical STI structure 140i—which is typically made up of high gap-fill deposited oxide material such as an HDP oxide or HARP/eHARP oxide—separates and defines two respective active regions 152a and 152b of a semiconductor material layer. Furthermore, in the manufacturing stage shown in FIG. 1G, the semiconductor device 170 has been exposed to at least some additional processing steps after the STI structure 140i was formed, such as cleaning and/or etching steps, and the like. Moreover, the semiconductor device 170 shown in FIG. 1G includes an additional passivation layer 145, which was formed above the device in preparation for the TEM process. The dashed line 146 indicates an interface between the passivation layer 145 and the underlying STI structure 140i, thus highlighting the irregular upper surface contour of the STI structure 140i.

As noted above, the semiconductor device 170 has been exposed to various cleaning and/or etching steps during device processing, and, due to the increased etch rates typically displayed by the high gap-fill deposited HDP or HARP/eHARP oxide materials, a divot 140d has been formed near an upper corner of the STI structure 140i, which, in the particular device shown, is on the order of approximately 7 nm. As may be appreciated by those of ordinary skill in the art, the presence of the divot 140d in the STI structure 140i can often lead to other processing-related problems. For example, depending on the size and/or depth of the divot 140d, residues that are created during other processing steps, such as cleaning and/or etching steps and the like, can sometimes build up in the divot 140d. Such residues can be difficult to remove, and if left in place, can lead to significant device operating problems, such as short problems or leakage. Additionally, as the size and/or depth of the divot 140d increases during device manufacture, other processing related issues may arise, as will be further discussed with respect to FIG. 1H and FIG. 1I below.

FIG. 1H is a TEM photograph of a representative semiconductor device 180 showing another type of divot defect 140d in an STI structure 140i. As shown in FIG. 1H, the semiconductor device 180 includes a typical gate electrode structure 160 formed above an active region 152a, and a non-functional gate electrode 161 formed above the STI structure 140i. As those of ordinary skill in the art may appreciate, non-functional gate electrode structures, such as the gate electrode structure 161, are sometimes formed above the isolation regions of a semiconductor device so as to provide a substantially uniform device patterning density, which can sometimes help reduce other processing-related deficiencies and/or defects, such as those associated with lithography patterning effects and CMP dishing effects, and the like. Additionally, a strained semiconductor material region 155 has been formed in the area of the source/drain region between the gate electrode structures 160 and 161.

Typically, the strained semiconductor material region 155 is selectively formed using an epitaxial growth process in a cavity (not shown) that is formed in the semiconductor material of the active region 152a between the two gate electrode structures 160, 161. However, due to the relatively higher etch rate associated with the HDP or HARP/eHARP oxide material of the STI structure 140i, a divot 140d (indicated by the dashed line 147) has been formed at the upper corner of the STI structure 140i. Furthermore, since an epitaxial growth process will only form silicon-based materials on the exposed surfaces of other silicon-based materials, the strained semiconductor material region 155 will not be fully formed due to faceting of epitaxially grown materials arising from the divot—, e.g., substantially up to the level of the gate dielectric layer of the gate electrodes 160 and 161—in the source/drain region between the gate electrodes 160 and 161, as shown in FIG. 1H. Furthermore, the presence of the divot 140d may also lead to the processing-related residue issues as previously described above.

FIG. 1I is a TEM photograph of yet another representative semiconductor device 190 that shows a different type of divot-related device defect. As shown in FIG. 1I, two closely spaced gate electrode structures 160 are formed above a common active region 152a of the semiconductor device 190. Additionally, the semiconductor device 190 includes raised source/drain regions 156, which are typically formed adjacent to the sides of the gate electrode structures 160 during an epitaxial growth process. However, FIG. 1I shows a divot-related defect wherein an extended portion 156e of one of the epitaxially formed raised source drain regions 156 has grown down and into a divot 140d that was formed in an upper corner of the STI structure 140i during earlier device processing steps, such as an etch and/or clean sequence and the like. As noted above, such defects can be difficult to remove, or can trap and/or leave behind residues during other processing activities, thus potentially leading to reduced device performance and or product yield.

The present disclosure is directed to various methods that may avoid, or at least reduce, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to methods for forming reverse shallow trench isolation structures with super-steep retrograde wells for use with field effect transistor elements. One illustrative method disclosed herein includes performing a thermal oxidation process to form a layer of thermal oxide material on a semiconductor layer of a semiconductor substrate, and forming a plurality of openings in the layer of thermal oxide material to form a plurality of isolation regions from the layer of thermal oxide material, wherein each of the plurality of openings exposes a respective surface region of the semiconductor layer.

In another illustrative embodiment disclosed herein, a method includes, among other things, performing a thermal oxidation process to form a thermal oxide material layer on a semiconductor layer of a semiconductor substrate, forming an opening in the thermal oxide material layer to expose a surface of the semiconductor layer, and forming a semiconductor layer stack in the opening and on the exposed surface.

In yet another embodiment, a method is disclosed that includes forming first and second openings in a thermal oxide material layer formed on a silicon-containing semiconductor material layer of a semiconductor substrate, the first and second openings exposing a surface of first and second regions, respectively, of the silicon-containing semiconductor material layer. The disclosed method further includes, among other things, forming a first semiconductor layer stack made up of a first plurality of semiconductor material layers in the first opening and on the surface of the first region, and forming a second semiconductor layer stack that is made up of a second plurality of semiconductor material layers in the second opening and on the surface of the second region, wherein the second semiconductor layer stack is different than the first semiconductor layer stack.

Also disclosed herein is an illustrative semiconductor device that includes a thermal oxide material layer positioned on a semiconductor layer of a semiconductor substrate, and a p-well region that is made up of, among other things, a first plurality of semiconductor material layers positioned in the thermal oxide material layer, wherein a first layer of the first plurality of semiconductor material layers is positioned on a first surface region of the semiconductor layer. Furthermore, the illustrative semiconductor device also includes an n-well region that is made up of, among other things, a second plurality of semiconductor material layers positioned in the thermal oxide material layer, wherein a first layer of the second plurality of semiconductor material layers is positioned on a second surface region of the semiconductor layer. The disclosed semiconductor device further includes an NMOS transistor element formed in and above the p-well region, and a PMOS transistor element formed in and above the n-well region.

BRIEF DESCRIPTION OF THE DRAWINGS

The disclosure may be understood by reference to the following description taken in conjunction with the accompanying drawings, in which like reference numerals identify like elements, and in which.

Figure 1A:
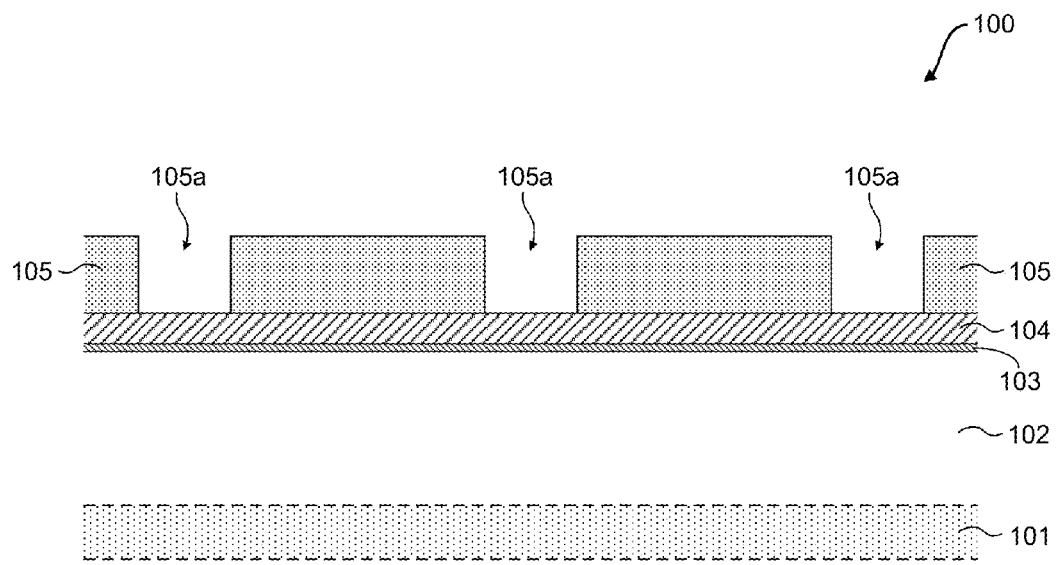
FIGS. 1A-1F schematically depict an illustrative conventional prior art process flow for forming shallow trench isolation structures in a semiconductor material layer of a semiconductor device.
Figure 1B:
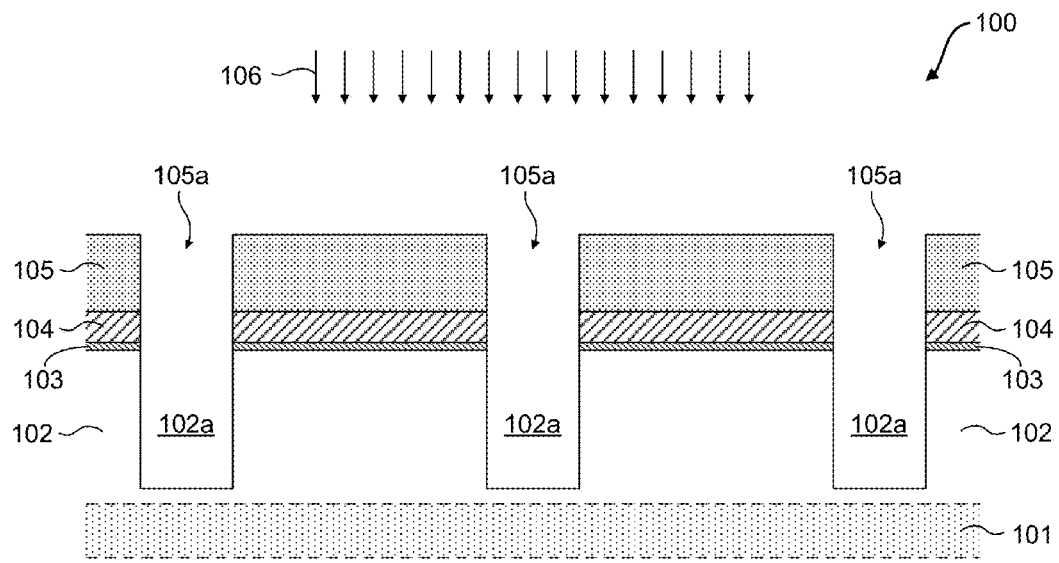
Figure 1C:
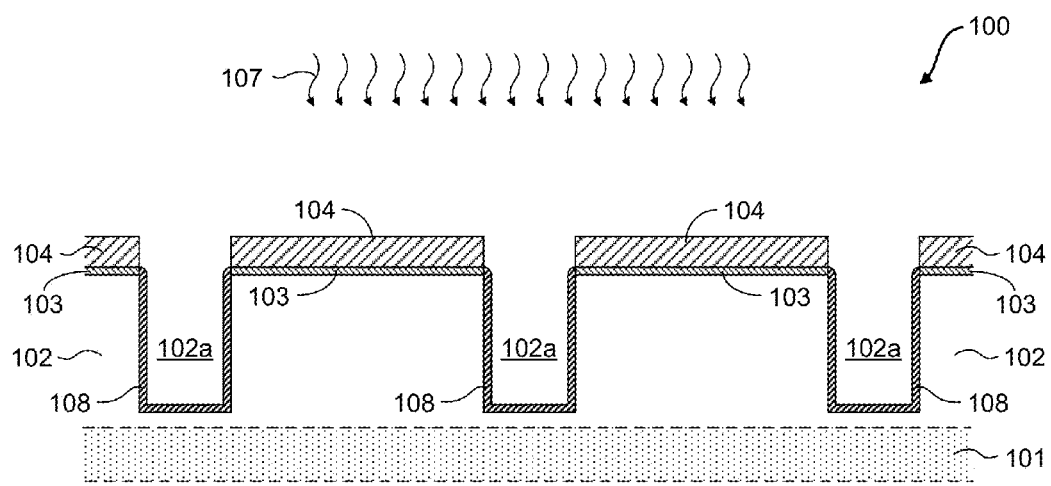
Figure 1D:
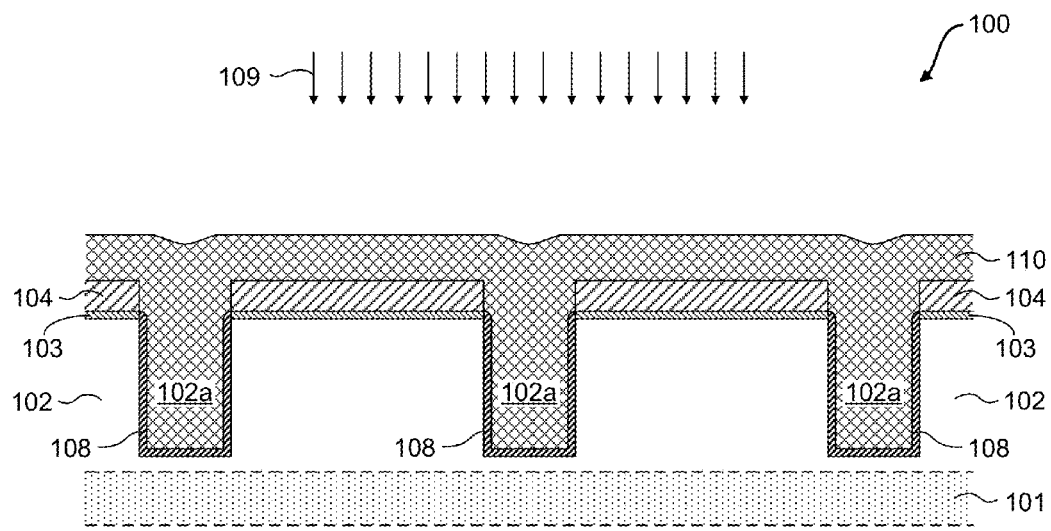
Figure 1E:
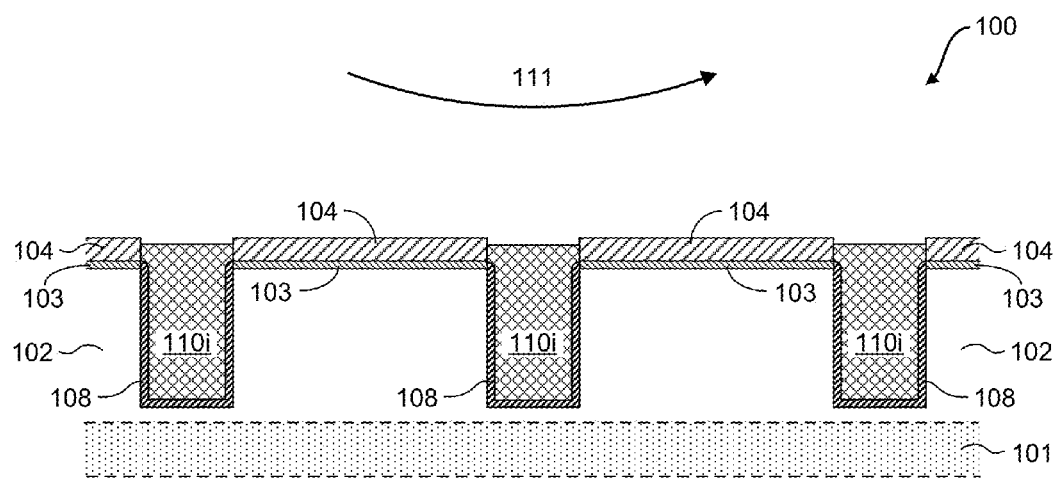
Figure 1F:
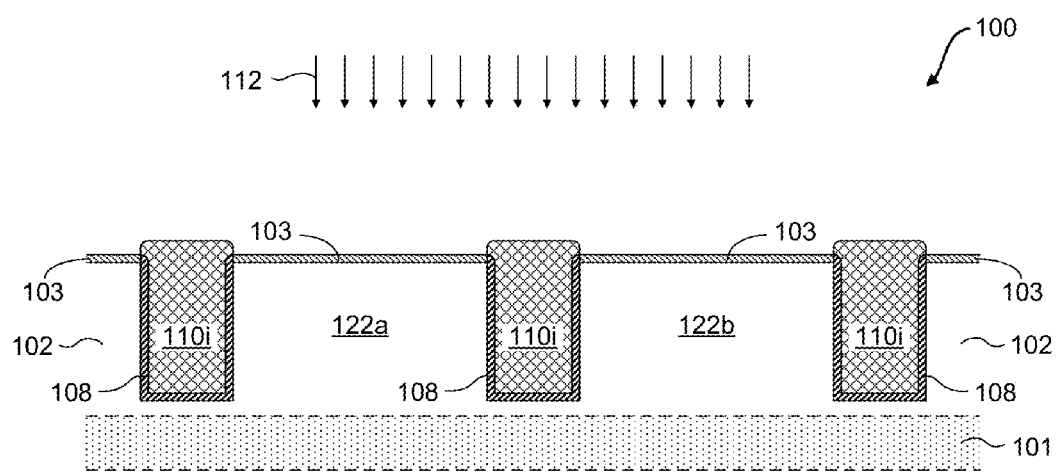

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter of the present disclosure is directed to methods for forming reverse shallow trench isolation (STI) structures above a semiconductor layer of a semiconductor device. In some embodiments of the present disclosure, the reverse STI structures may be formed by forming a thermally grown silicon dioxide (thermal oxide) material on the surface of a semiconductor material layer, and then patterning the thermal oxide material layer so as to expose certain regions of the semiconductor layer. Semiconductor device active regions, such as n-well regions and/or p-well regions, may then be formed above the exposed regions of the semiconductor layer, such that the reverse STI structures substantially surround and electrically isolate the various active regions of the semiconductor device. Thereafter, further manufacturing activities may continue based on well-known processing techniques so as to form circuit elements, such as transistor elements and the like, in the various active regions of the device.

For example, in some embodiments, traditional silicon-based and/or advanced high-k/metal gate electrode transistor devices may be formed in the active regions defined by the reverse STI structures of the present disclosure. Furthermore, the transistor devices may be formed utilizing any well-known gate electrode manufacturing strategy, such as so-called gate processes, gate last or replacement gate processes, and/or a modified replacement gate processes. Irrespective of the device processing strategy employed, it should be appreciated by a person of ordinary skill in the art having full benefit of the present disclosure that, since the reverse STI structures of the present disclosure may be made up of a more etch resistant thermal oxide material, the occurrence of the above-described STI divot problems—which are typically associated with the higher etch rate deposited oxide materials, such as HDP oxide and/or HARP/eHARP oxide materials and the like—may be reduced or even substantially avoided during the later device processing stages. Moreover, even though the semiconductor devices illustrated and described in the present disclosure are generally represented by substantially planar device configurations, it should be understood that the techniques set forth herein are equally applicable to 3-dimensional (3D) devices, such as fin-FETs and the like.

Depending on the desired integration scheme and/or region conductivity type, the device regions may be formed using epitaxial deposition techniques, wherein appropriate dopant types may be incorporated in situ into the active regions during the various phases of the epitaxial process. In other embodiments, well-known implantation techniques may be used to implant specific dopant types into the active regions after some or all of the epitaxial material has been formed therein.

Furthermore, in some illustrative embodiments disclosed herein, the device active regions may be formed as super-steep retrograde wells (SSRW). In general, devices utilizing SSRW configurations are characterized by a device geometry having an undoped channel region and a substantially uniform lateral dopant distribution across the well, which, in some applications, may tend to minimize short channel effects and substantially reduce off-state leakage current in CMOS devices. Additionally, the substantially laterally-uniform dopant concentrations in SSRW devices may provide better carrier transport properties, reduced variations in device threshold voltages, which are generally caused by the ionized impurities introduced into the channel region and random dopant fluctuations that may occur during halo region doping.

With respect to the descriptions of the various illustrative embodiments set forth herein, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 200 depicted in FIG. 2B, it should be understood that the mask layer 204 is formed "above" the thermal oxide layer 203, the semiconductor layer 202 is positioned "below" or "under" thermal oxide layer 203, and the patterned opening 204A is formed "in" the mask layer 204. Similarly, it should also be appreciated that the well opening 203a shown in FIG. 2B is formed "in" the thermal oxide layer 203, and the boron-doped silicon material layer 205 shown in FIG. 2D is positioned "on" the semiconductor layer 202 and "inside" of the well opening 203a.

Figure 2A:
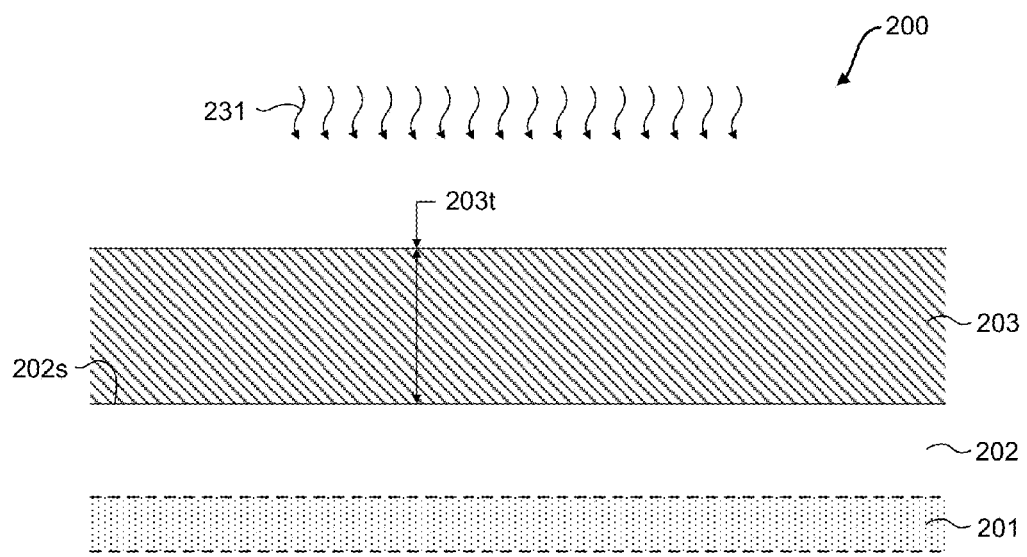
FIGS. 2A-2N schematically depict some exemplary processing steps that may be used to form the reverse shallow trench isolation regions with super-steep retrograde wells of the present disclosure according to various illustrative embodiments.
Figure 2B:
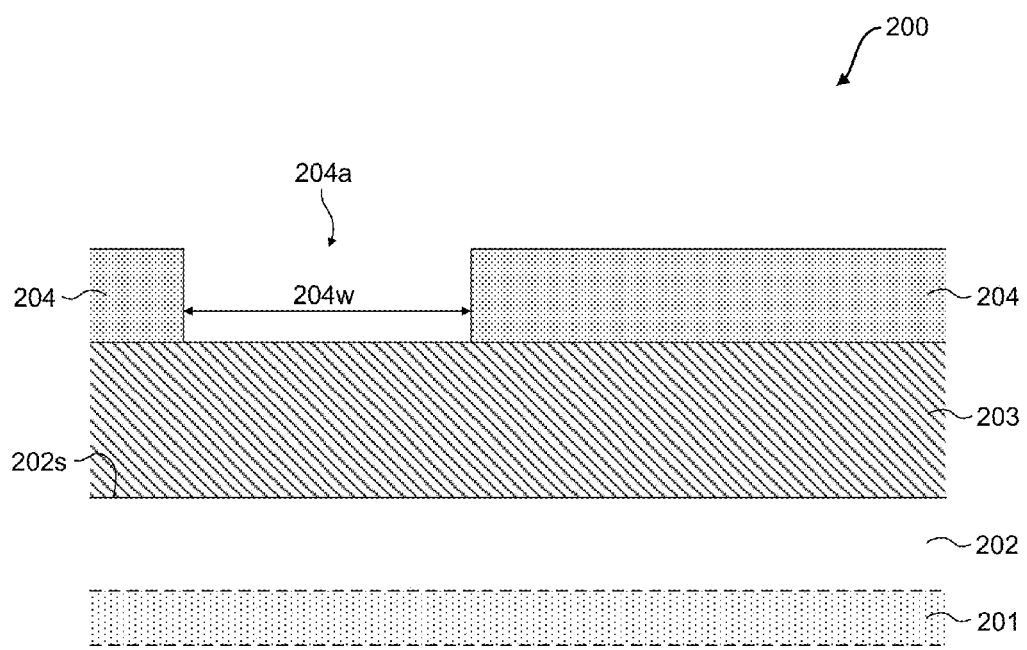
Figure 2C:
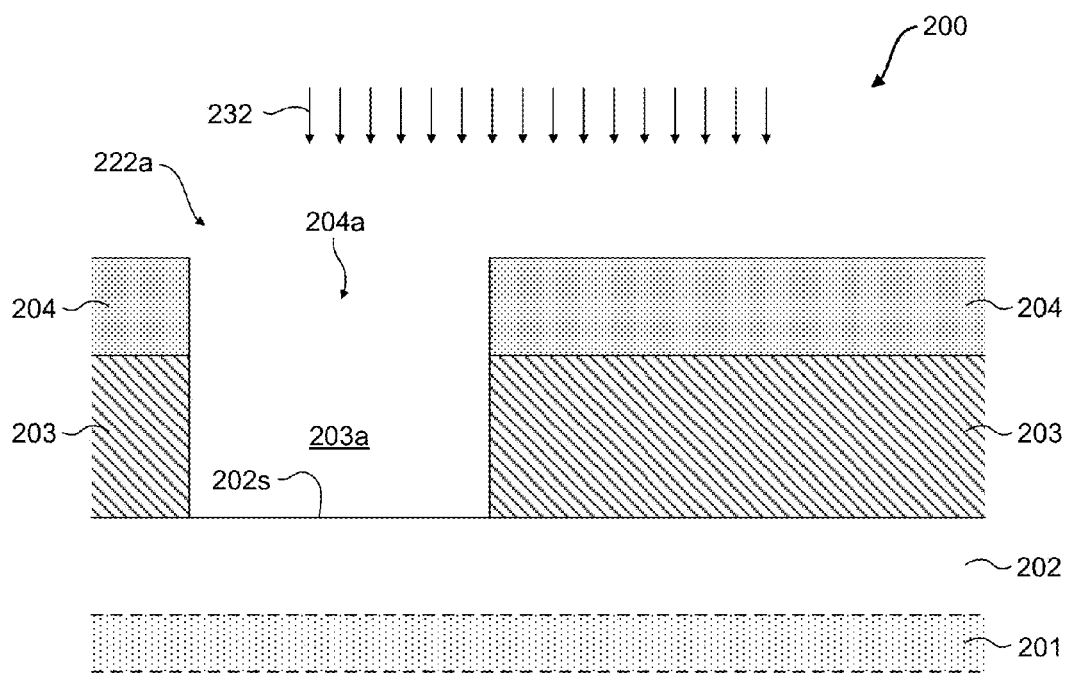
Figure 2D:
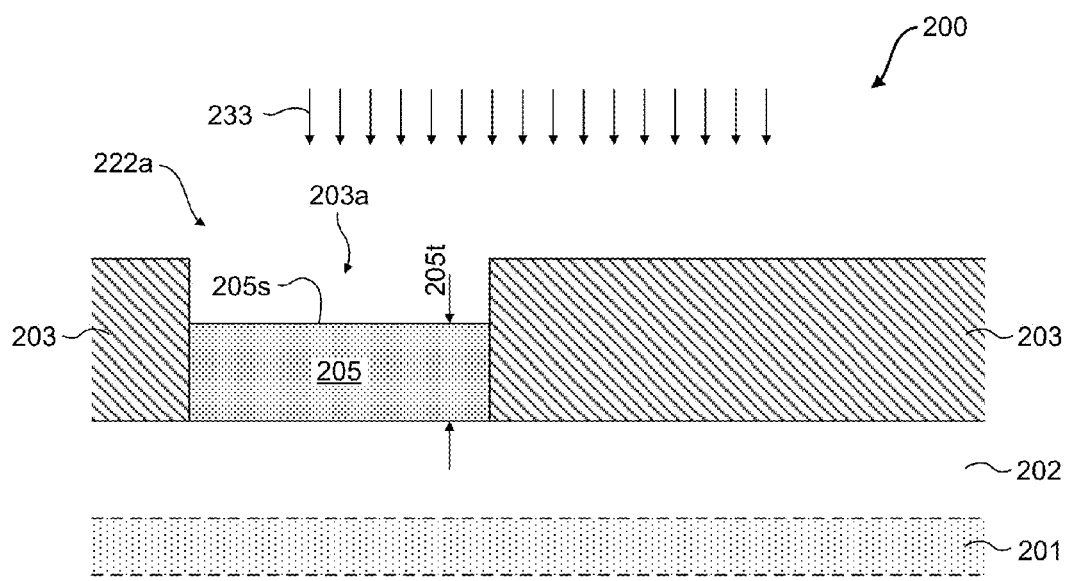
Figure 2E:
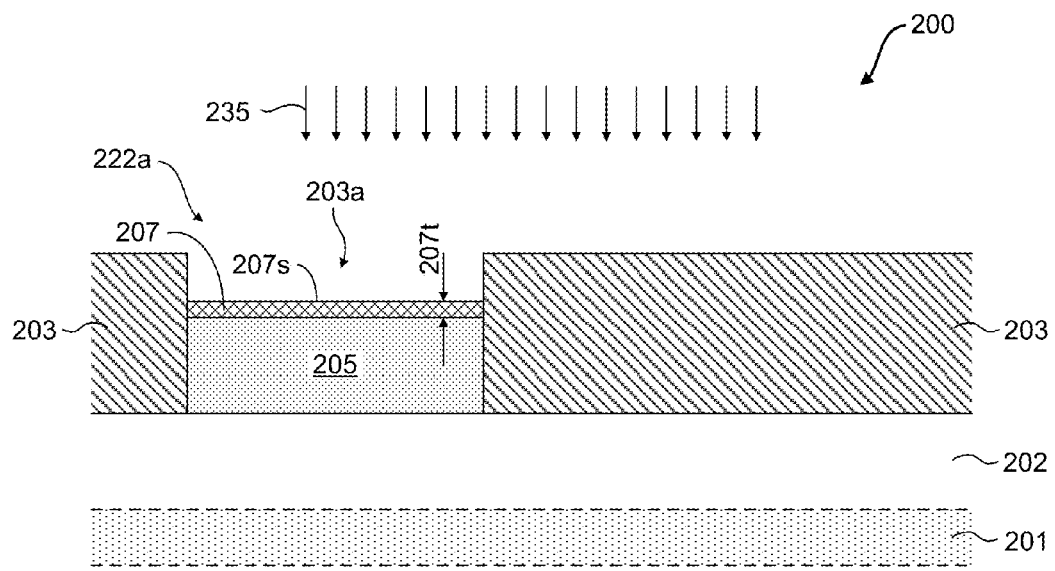
Figure 2F:
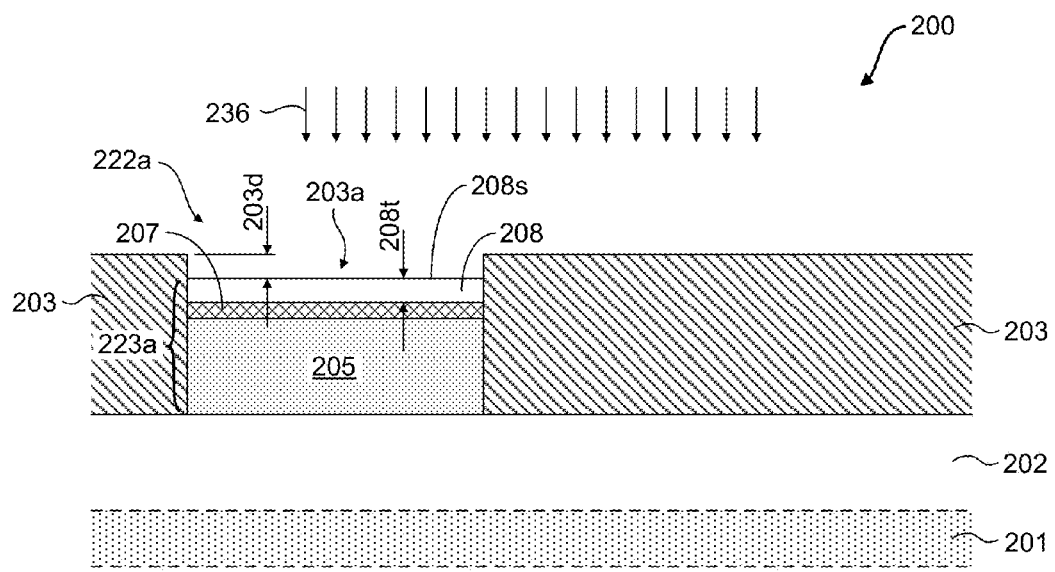
Figure 2G:
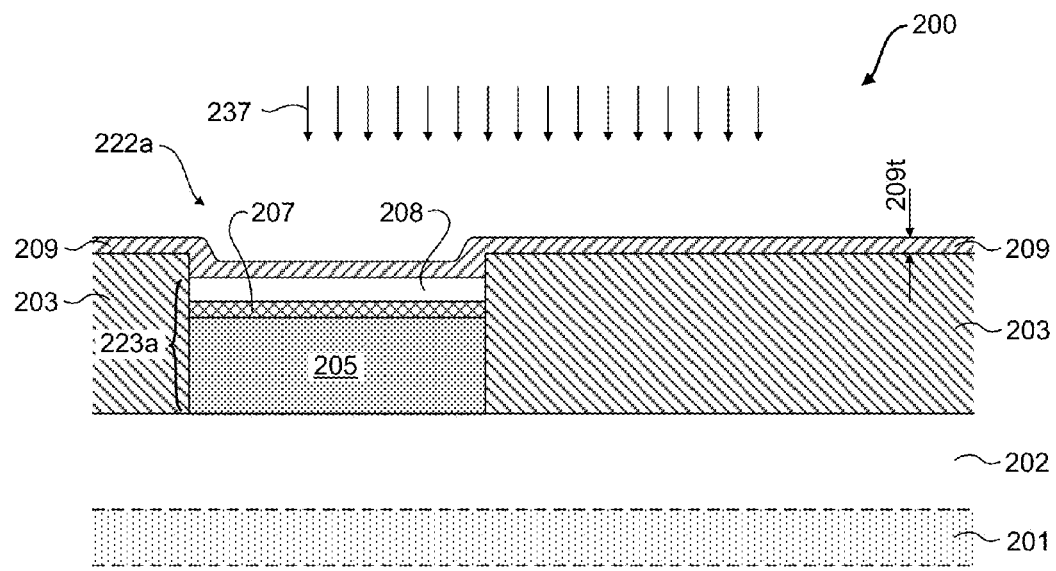
Figure 2H:
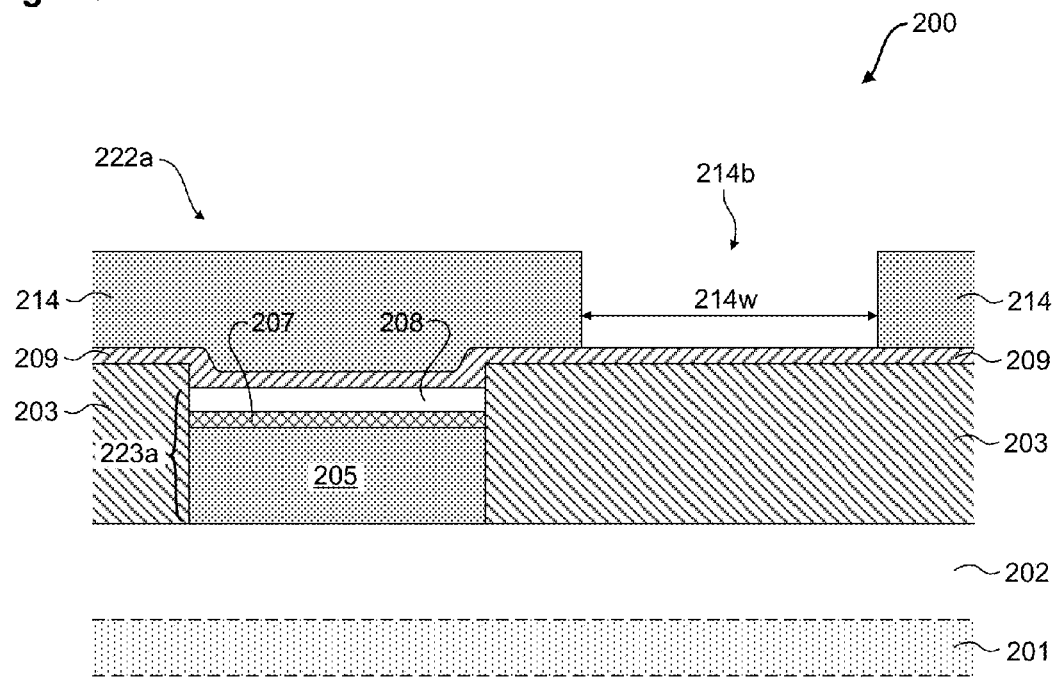
Figure 2I:
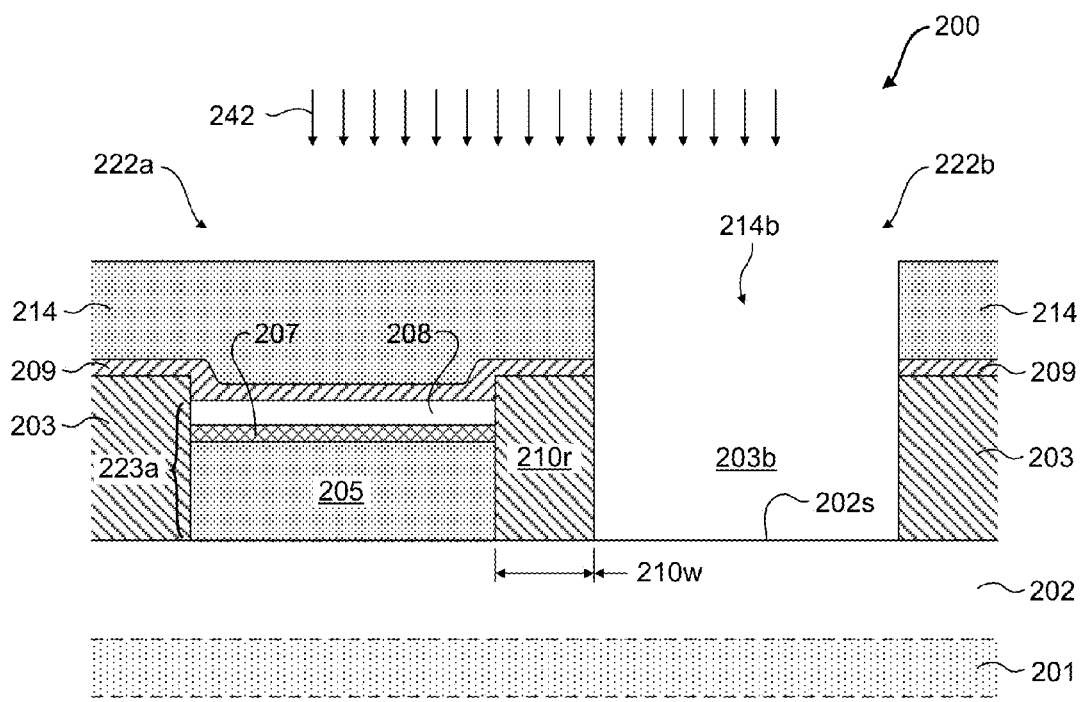
Figure 2J:
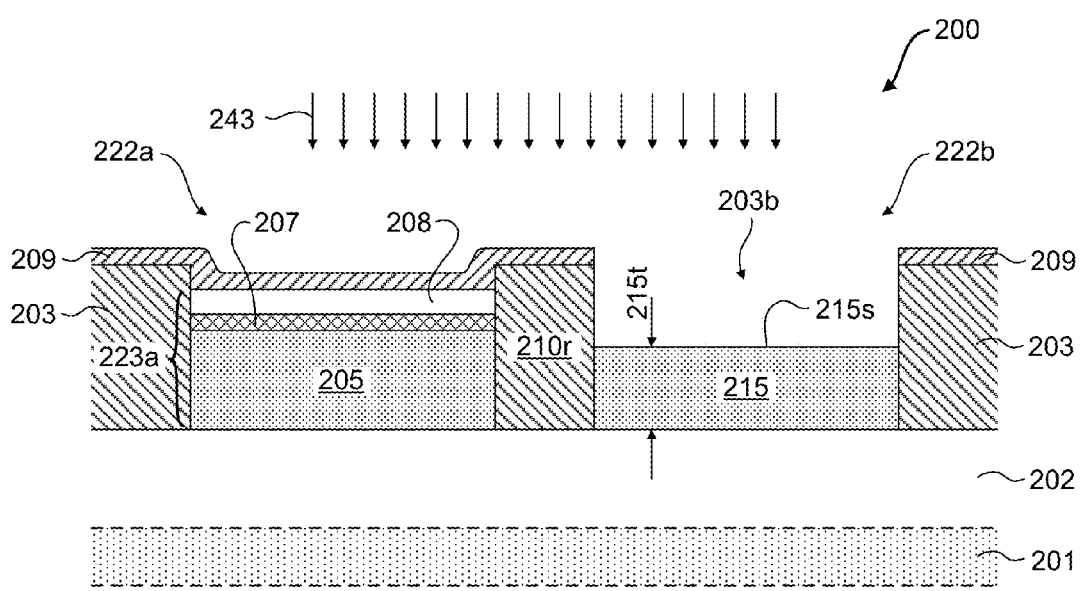
Figure 2K:
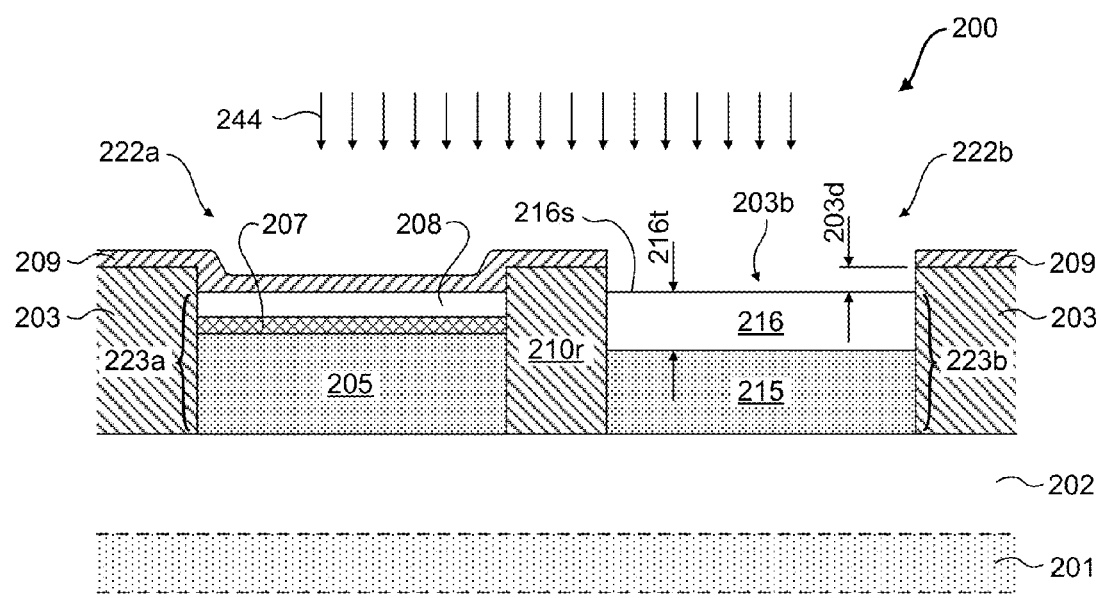
Figure 2L:
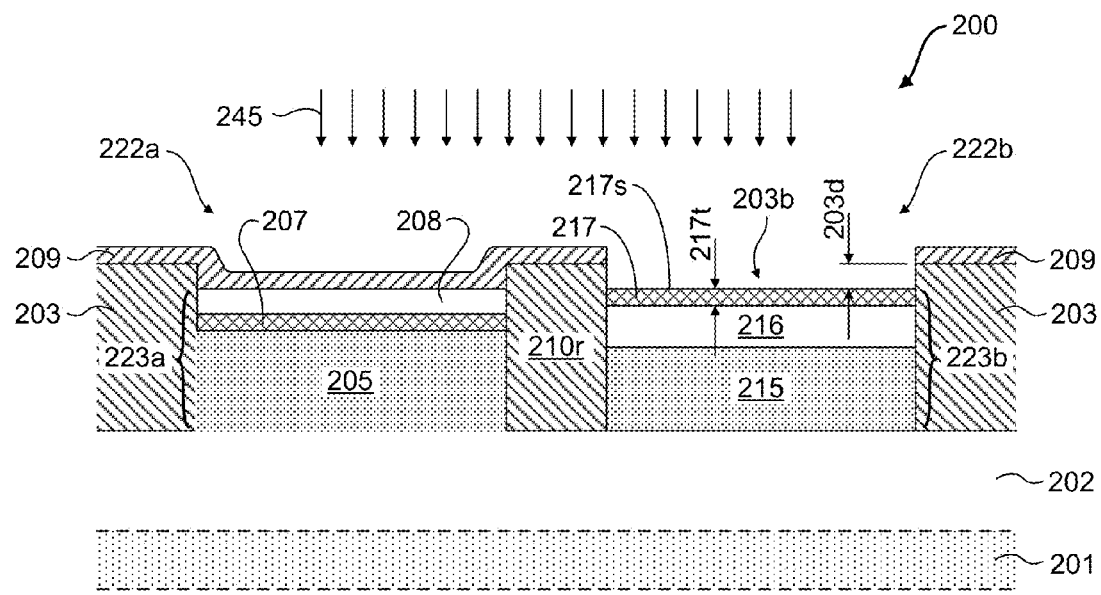
Figure 2M:
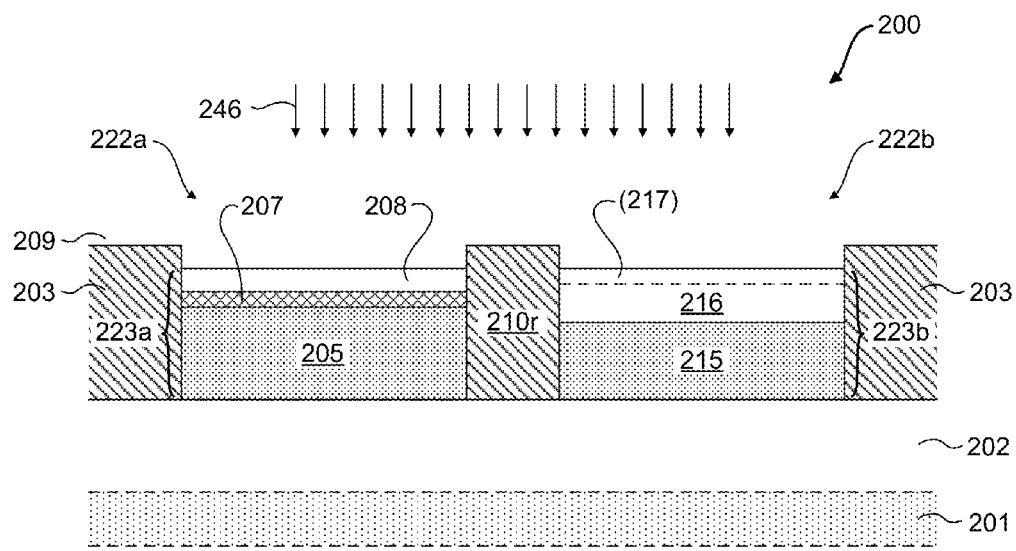
Figure 2N:
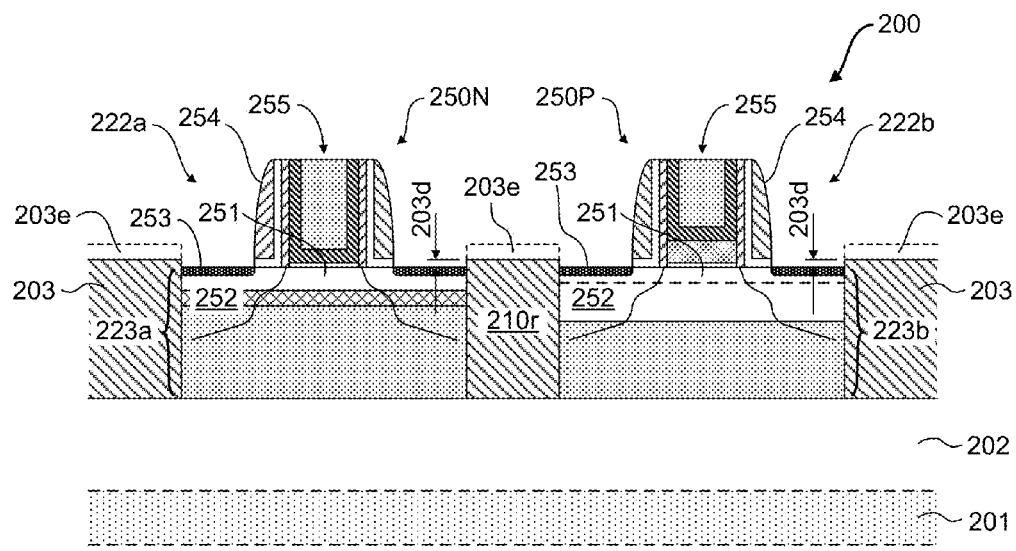

FIGS. 2A-2N, which schematically illustrate some exemplary processing steps that may be used to form the reverse shallow trench isolation regions with super-steep retrograde wells of disclosed herein, will be described in detail below.

FIG. 2A schematically depicts a cross-sectional view of an illustrative semiconductor device 200 of the present disclosure during an early device processing stage. As shown in FIG. 2A, the semiconductor device 200 may include, among other things, a substrate 201 having a semiconductor layer 202. Depending on the device design requirements, the semiconductor layer 202 of the substrate 201 may be formed on or be part of a substantially crystalline semiconductor substrate material, while in other cases the semiconductor device 200 may be formed on the basis of a silicon-on-insulator (SOI) architecture, in which case a buried insulating layer (not shown) may be provided below the semiconductor layer 202. Furthermore, in at least some illustrative embodiments, the semiconductor layer 202 may be a substantially pure silicon material, i.e., without dopants or other alloying materials, as the various active regions of the semiconductor device 200 that may require dopants and/or an alloyed semiconductor material may be formed on and above the surface 202s of the semiconductor layer 202 during later device processing stages.

As shown in FIG. 2A, the semiconductor layer 202 of the substrate 201 may be exposed to a thermal oxidation process 231 so as to grow a layer of silicon dioxide 203 (hereinafter referred to as thermal oxide layer 203) on the surface 202s of the semiconductor layer 202. The thickness 203t of the thermal oxide layer 203 may be established as required, depending on the desired depth of the later-formed reverse shallow trench isolation structures 210r (see, e.g., FIG. 2I), and correspondingly the depth of the active region wells 222a and 222b (see, e.g., FIGS. 2C and 2I). In certain exemplary embodiments, the thickness 203t of the thermal oxide layer 203 may range from approximately 200-300 nm, although other thicknesses may also be used, depending on the overall requirements of the semiconductor device 200.

The thermal oxidation process 231 may be based on any one of several recipes well known in the art. For example, in some illustrative embodiments, the thermal oxidation process 231 may be a wet oxidation process or a dry oxidation process performed at a temperature in the range of approximately 800-1200° C. Furthermore, the duration of the thermal oxidation process 231 may be adjusted as necessary depending on the various processing parameters, such as the process type (wet or dry), the specific exposure temperature, the desired thickness 203t of the thermal oxide layer 203, and the degree of thickness control required.

FIG. 2B schematically illustrates the semiconductor device 200 of FIG. 2A in a further processing stage, after the thermal oxide layer 203 has been formed on the surface 202s of the semiconductor layer 202, and a mask layer 204 has been formed above the thermal oxide layer 203. In some embodiments, the mask layer 204 may be, for example, a photoresist layer and the like, which may be patterned using well-known photolithography techniques to include an appropriately sized opening 204a that may be used during a later manufacturing stage to form a device well 222a (see, FIG. 2C) in an appropriate location above the semiconductor layer 202. In certain embodiments the width 204w of the opening 204a—which may be considered to be substantially aligned with the gate length of a subsequently formed transistor device, such as the transistor device 250N shown in FIG. 2N—may be on the order of approximately 100 nm, although smaller opening widths 204w may be used, depending on the specific device technology node size. In other embodiments, the width 204w of the opening 204a may be larger, such as approximately 1-2 µm or more, depending on the types and quantity of devices to be formed during later manufacturing stages, as well as on the overall layout requirements of any circuits (not shown) formed as part of the semiconductor device 200.

FIG. 2C schematically depicts the illustrative semiconductor device 200 of FIG. 2B during a subsequent processing stage, wherein the device 200 is exposed to an etch process 232. In some embodiments, the etch process 232 may be a suitably designed anisotropic etch process, such as a reactive ion etch (RIE) process and the like, which may be used to etch the material of the thermal oxide layer 203 through the opening 204a in the mask layer 204. The etch process 232 is continued until the surface 202s of the semiconductor layer 202 is exposed, and an opening 203a is formed in thermal oxide layer 203 and in a well region 222a of the semiconductor device 200, and which may eventually be filled so as to form a super-steep retrograde well (SSRW), as will be further discussed below. In certain embodiments, the etch recipe of the etch process 232 may be appropriately adjusted so as to selectively remove the silicon dioxide material of the thermal oxide layer 203 relative to the semiconductor layer 202, e.g., silicon, based on a substantial difference in etch rates, thus efficiently stopping the etch process at the surface 202s without undue etch damage to the semiconductor layer 202.

FIG. 2C shows the semiconductor device 200 after the opening 203a has been formed in the thermal oxide layer 203 in the well region 222a, which will hereinafter be referred to as a first SSRW region 222a.

As shown in the illustrative manufacturing stage illustrated in FIG. 2D, an epitaxial growth process 233 may be used to form a semiconductor material layer 205 of the first SSRW region 222a in the opening 203a. As may be appreciated, during an epitaxial growth process, such as the epitaxial growth process 233, a semiconductor material, such as the semiconductor material layer 205, will only be formed on the exposed surfaces of other silicon-based semiconductor materials, such as the semiconductor layer 202, and will not be formed on the exposed surfaces of any insulating dielectric materials, such as the thermal oxide layer 203. Therefore, the semiconductor material layer 205 is selectively formed only on the exposed surface 202s (see, FIG. 2C) of the semiconductor layer 202, and confined within the opening 203a. In certain embodiments, the thickness 205t of the semiconductor material layer 205 may be in the range of approximately 175-225 nm, depending on the overall design of the first SSRW region 222a, including the material types and thicknesses of subsequently formed material layers, as will be further described below.

In some exemplary embodiments of the present disclosure, the first SSRW region 222a may represent, for example, a p-well region, in and above which may be formed an NMOS transistor element during later device processing stages. See, e.g., FIG. 2N, described below. Accordingly, in such embodiments, the semiconductor material layer 205 may include an appropriate p-type dopant material, such as boron and the like, for establishing the base conductivity of the first SSRW (p-well) region 222a. In certain embodiments, the p-type dopant, e.g., boron, may be incorporated on an in situ basis into the semiconductor material layer 205 by in situ doping during the epitaxial growth process 233. In other illustrative embodiments, and depending on the overall processing strategy, the dopant material may be incorporated into the semiconductor material layer 205 during a traditional ion implantation process (not shown). It should be appreciated, however, that using an ion implantation approach may require that an additional annealing process be performed so as to heal any crystalline lattice damage that is created during ion implantation, which may have an influence on the overall thermal budget of the semiconductor device 200.

FIG. 2E schematically depicts the illustrative semiconductor device 200 during a further device manufacturing stage, wherein the device 200 is exposed to an epitaxial growth process 235. As with the previously-described epitaxial growth process 233, material will only be formed on exposed silicon-containing material surfaces during the epitaxial growth process 235. Therefore, as shown in FIG. 2E a semiconductor material layer 207 may be selectively formed on the exposed surface 205s (see, FIG. 2D) of the semiconductor material layer 205.

In some illustrative embodiments, the material composition of the semiconductor material layer 207 may be adjusted so that the layer 207 acts substantially as a diffusion blocking material layer during any subsequent diffusion annealing processes, as described above. For example, in certain embodiments, the semiconductor material layer 207 may be a carbon-doped silicon material, e.g., silicon-carbon, whereas in other embodiments the layer 207 may include other materials that are known to provide a diffusion-blocking capability. Depending on the specific material composition that is used for the semiconductor material layer 207, the diffusion-blocking material may be incorporated into the semiconductor material layer 207 in situ during the epitaxial growth process 235 by adjusting the process ambient conditions used during the epitaxial growth process 234, as previously described. Furthermore, in those embodiments wherein the semiconductor material 207 is a carbon-doped silicon material, the carbon dopant may be implanted using an appropriately designed ion implantation process (not shown).

As may be appreciated by those of ordinary skill in the art, boron dopants readily and quickly diffuse through silicon-based semiconductor materials. Furthermore, in certain embodiments, device design requirements may dictate that an undoped semiconductor material layer be formed above the semiconductor material layer 207, in which may eventually be positioned a channel region of an NMOS transistor element (see, e.g., FIG. 2N). Accordingly, the presence of the diffusion-blocking silicon-carbon material layer 207 may substantially prevent the diffusion of boron ions into any material layers formed thereabove, where the presence of p-type boron dopants may be undesirable. In at least some embodiments, the semiconductor material layer 207 may be relatively thin, wherein the thickness 207t ranges from approximately 5-10 nm, although it should be understood that other thicknesses may also be used.

FIG. 2F illustrates the semiconductor device 200 during a subsequent processing phase, wherein a topmost semiconductor material layer 208 of a first semiconductor layer stack 223a in the first SSRW region 222a is selectively formed on the exposed surface 207s (see, FIG. 2E) of the semiconductor material layer 207 during an epitaxial growth process 236, thereby substantially completing the first layer stack 223a. In at least some embodiments, the semiconductor material layer 208 may be a substantially dopant-free semiconductor material, such as silicon and the like, which may eventually include the channel region of a subsequently formed NMOS transistor element as previously described. As with previous semiconductor material layers, the semiconductor material layer 208 may be formed by adjusting the process ambient conditions used during the previous epitaxial step. Depending on the device requirements, the thickness 208t of the semiconductor material layer 208 may be in the range of approximately 5-15 nm, although other layer thicknesses may also be used.

While the exemplary embodiments of the present disclosure illustrated in FIGS. 2D-2F show a first semiconductor layer stack 223a that includes three semiconductor material layers 205, 207 and 208, it should be appreciated that the number, thickness, and material type of semiconductor material layers described herein is illustrative only, as the methods taught by the disclosed subject matter may readily encompass both more and fewer semiconductor material layers. For example, in at least some embodiments, the first semiconductor layer stack 223a may include two semiconductor layers, whereas in other embodiments the layer stack 223a may include four, five, six, or even more semiconductor material layers. Furthermore, while the topmost semiconductor material layer 208 of the first semiconductor layer stack 223a illustrated in FIG. 2F and described above may be a substantially dopant-free semiconductor material, it is well within the spirit of the present disclosure for the topmost layer of any semiconductor layer stack disclosed herein to contain an appropriate dopant material, such as a p-type dopant material in the case of the first SSRW (p-well) region 222a.

Figure 1G:
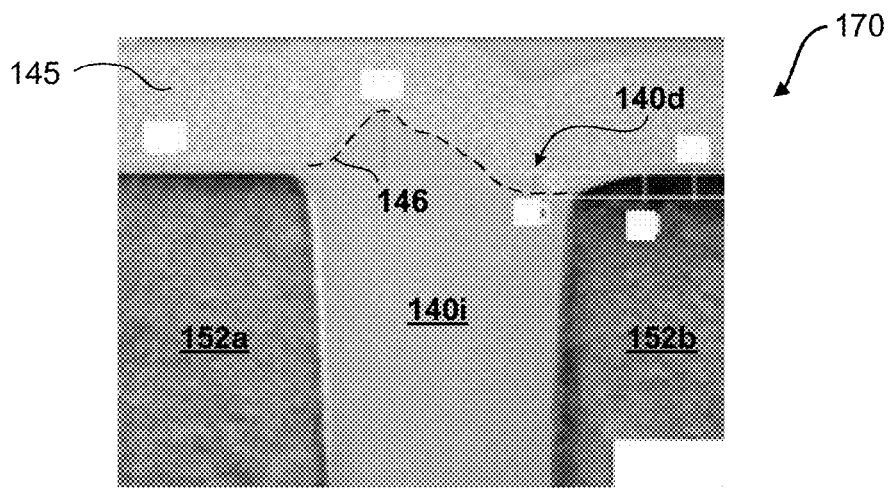
FIGS. 1G-1I are transmission electron microscopy photographs showing representative divot defects in semiconductor devices which utilize shallow trench isolation structures that are formed in accordance with some conventional prior art process flows.
Figure 1H:
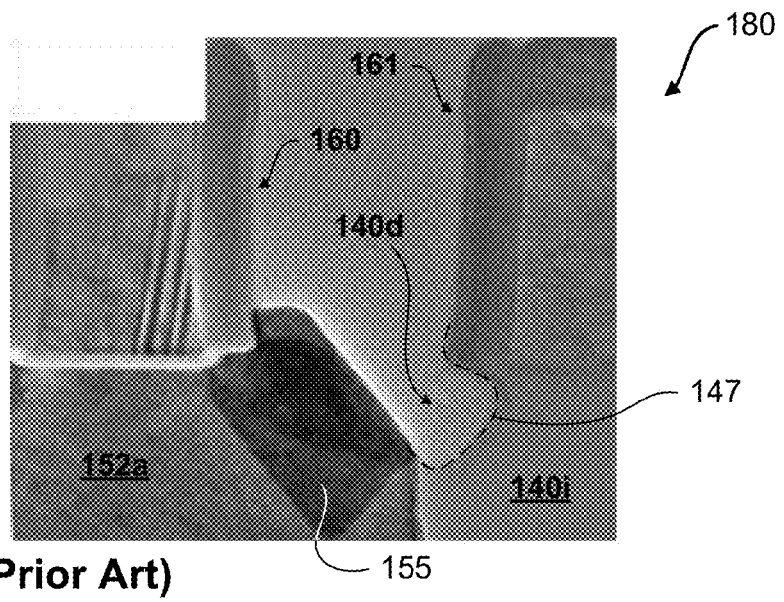
Figure 1I:
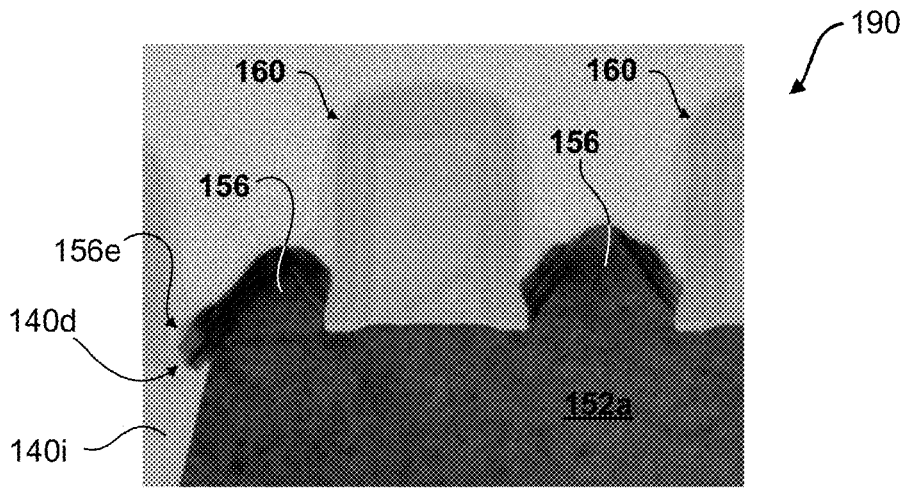

In certain exemplary embodiments, the total overall height of the first semiconductor layer stack 223a in the first SSRW region 222a may be adjusted so that the upper surface 208s of the semiconductor material layer 208 may recessed within the opening 203a by a depth 203d. In this way, a certain amount of "excess" isolation material may effectively be provided in any subsequently formed reverse STI structures 210r (see, e.g., FIG. 2I), which may act to substantially reduce the likelihood that any etch-related divot type defects (see, FIGS. 1G-1I) occur during subsequent device processing steps. Accordingly, the amount of "excess" isolation material—i.e., the depth 203d—may be adjusted as required in view of the amount and severity of exposure to cleaning and/or etching steps for the specific integration sequence involved. For example, in some embodiments, the depth 203d may be the order of approximately 8-12 nm, although it should be understood that both greater and lesser depths may also be contemplated.

FIG. 2G shows the semiconductor device 200 of FIG. 2F during a further manufacturing stage, wherein a deposition process 237 is performed so as to form a hard mask layer 209 above the device 200. As shown in FIG. 2G, the hard mask layer 209 covers the first SSRW region 222a so that the upper surface 208s (see, FIG. 2F) of the semiconductor material layer 208 formed in the opening 203a will not be directly exposed to any further epitaxial growth processes. The hard mask layer 209 therefore may act as a deposition mask, or an epitaxial growth mask, thus preventing any additional semiconductor material from being formed on the semiconductor material in the first SSRW region 222a.

In certain embodiments, the hard mask layer 209 may be any suitable dielectric material, which may thus act to prevent epitaxial material formation on the semiconductor material layer 208. Furthermore, in at least some embodiments, the material of the hard mask layer 209 may be selectively etchable relative to the material of the thermal oxide layer 203. For example, the dielectric hard mask layer 209 may be silicon nitride or silicon oxynitride, selective etch recipes for which are well known in the art. The hard mask layer 209 may be formed by any one of several suitable deposition processes, such as chemical vapor deposition (CVD), physical vapor deposition (PVD), and the like. Additionally, the thickness 209t of the hard mask layer 209 may be adjusted as required so that the upper surface 208s of the first SSRW region 222a is substantially completely covered. For example, the thickness 209t may be in the range of approximately 10-20 nm. Other thicknesses may also be used.

FIG. 2H schematically depicts the illustrative semiconductor device 200 in a further advanced processing stage, after a mask layer 204, such as a photoresist mask layer and the like, has been formed above the device 200. As previously described with respect to the mask layer 204 above, the mask layer 204 may be patterned using well-known photolithography techniques to include an appropriately sized opening 214b that may be used during a later manufacturing stage to form a second device well 222b (see, FIG. 2I) in an appropriate location above the semiconductor layer 202. In certain embodiments the width 214w of the opening 214b—which may be considered to be substantially aligned with the gate length of a subsequently formed transistor device, such as the transistor device 250P shown in FIG. 2N—may be on the order of approximately 100 nm, although smaller opening widths 214w may also be used. In other embodiments, the width 214w may be larger, such as approximately 1-2 μm or more, depending on the specific design and layout of the semiconductor device 200.

FIG. 2I shows the illustrative semiconductor device 200 of FIG. 2H during a subsequent processing stage, wherein the device 200 is exposed to an etch process 242 that may be used to form an opening 203b in the thermal oxide layer 203. In some embodiments, the etch process 232 may be a suitably designed anisotropic etch process, such as a reactive ion etch (RIE) process and the like, which may be used to etch both the material of the hard mask layer 209 as well as the material of the thermal oxide layer 203 through the opening 214b in the mask layer 214. Furthermore, the etch process 232 may be continued until the surface 202s of the semiconductor layer 202 is exposed in a second well region 222b of the semiconductor device 200. In certain embodiments, the opening 203b may also be filled so as to form a second super-steep retrograde well (SSRW), as will be further discussed below. In certain embodiments, the etch recipe of the etch process 232 may be adjusted as required so as to remove the material of the dielectric hard mask layer 209, and thereafter selectively remove the silicon dioxide material of the thermal oxide layer 203 relative to the semiconductor layer 202, as previously described above.

Also as shown in FIG. 2I, after completion of the etch process 232, a reverse shallow trench isolation (STI) structure 210r is positioned between the first SSRW region 222a and the second SSRW region 222b. It should be appreciated that the reverse STI structure 210r will eventually electrically isolate any devices formed in the first SSRW region 222a from any devices formed in the second SSRW region 222b (see, e.g., FIG. 2N), once processing of the semiconductor device 200 has been completed. In some exemplary embodiments, the width 210w of the reverse STI structure 210r may be in range of approximately 40-50 nm or even less, whereas in other embodiments, the width 210w may be as great as 1-2 μm or even larger. It should be appreciated, however, that other widths may also be contemplated. FIG. 2I shows the semiconductor device 200 after the opening 203b has been formed in the second well region 222b, which will hereinafter referred to as a second SSRW region 222b.

As shown in FIG. 2J, an epitaxial growth process 243 may be used to selectively form a semiconductor material layer 215 on the exposed surface 202s of the semiconductor layer 202 in the second SSRW region 222b, and which may therefore be confined within the opening 203b. Furthermore, as may be appreciated, the hard mask layer 209 substantially prevents any epitaxial growth of the semiconductor layer 215 on the first semiconductor layer stack 223a in the first SSRW region 222a. In certain embodiments, the thickness 215t of the semiconductor material layer 205 may be in the range of approximately 150-200 nm, depending on the overall design of the second SSRW region 222b, including the material types and thicknesses of subsequently formed material layers, as will be further described below.

In some exemplary embodiments of the present disclosure, the second SSRW region 222b may represent, for example, an n-well region, in and above which may be formed a PMOS transistor element during later device processing stages. See, e.g., FIG. 2N, described below. Accordingly, in such embodiments, the semiconductor material layer 215 may include an appropriate n-type dopant material—such as phosphorous, arsenic, antimony, and the like—for establishing the base conductivity of the second SSRW (n-well) region 222b. In certain embodiments, the n-type dopant, e.g., phosphorous, arsenic, or antimony, may be incorporated in situ into the semiconductor material layer 215 by including the appropriate ion type (e.g., P, As, or Sb) in the process ambient during the epitaxial growth process 243. In other illustrative embodiments, and depending on the overall processing strategy, the dopant material may be incorporated into the semiconductor material layer 215 during a traditional ion implantation process (not shown). It should be appreciated, however, that if an ion implantation approach is utilized to incorporate n-type dopants into the semiconductor layer 215, the thickness 209t (see, FIG. 2G) of the hard mask layer 209 may need to be proportionally increased so as to prevent any undesirable implantation of dopant ions into the substantially dopant-free top semiconductor material layer 208 of the first semiconductor layer stack 223a in the first SSRW region 222a.

FIG. 2K shows the semiconductor device 200 during a further manufacturing stage, wherein an epitaxial growth process 244 may be used to selectively form a topmost semiconductor material layer 216 of a second semiconductor layer stack 223b in the second opening 203b and on the exposed surface 215s (see, FIG. 2J) of the semiconductor material layer 215, thereby substantially completing the second layer stack 223b in the second SSRW region 222b. Depending on the overall device design parameters, the semiconductor material layer 216 may be a substantially dopant-free semiconductor material, such as silicon and the like, which may eventually include the channel region of a subsequently formed PMOS transistor element. In certain embodiments, the process ambient conditions used during the epitaxial growth process 244 may be substantially similar to those used during the previous epitaxial growth process 243, wherein however the process ambient may be adjusted by eliminating the n-type dopant ions as required so as to form the substantially dopant-free semiconductor material layer 216.

While the exemplary embodiments of the present disclosure illustrated in FIGS. 2J and 2K show a second semiconductor layer stack 223b that includes only two semiconductor material layers 215 and 216, it should be appreciated that, as with the first semiconductor layer stack 223a described above, the number, thickness, and material type of semiconductor material layers described herein is illustrative only, as the second semiconductor layer stack 223b may include three, four, or even more semiconductor material layers, as will be further described with respect to other illustrative embodiments below. Additionally, while the topmost semiconductor material layer 216 of the second semiconductor layer stack 223b illustrated in FIG. 2K and described above may be a substantially dopant-free semiconductor material, the semiconductor material layer 216 may also contain an appropriate dopant material.

In at least some embodiments, the thickness 216t of the semiconductor material layer 216 may be in the range of approximately 50-100 nm, although it should be understood that other thicknesses may also be used. Additionally, in certain embodiments, the total overall height of the second semiconductor layer stack 223b in the second SSRW region 222b may be adjusted so that the upper surface 216s of the semiconductor material layer 216 may recessed within the opening 203b by a depth 203d, such as is discussed with respect to the first semiconductor layer stack 223a in the first SSRW region 222a. For example, the depth 203d may range from approximately 8-12 nm, although it should be understood that both greater and lesser depths may also be used, depending on the expected amount and severity of cleaning and/or etching processes to be performed during later manufacturing stages.

While the diffusion rates of n-type dopant materials, such as phosphorous, arsenic and antimony, are typically substantially slower than the diffusion rate of a p-type dopant such as boron, it should be appreciated that some amount of n-type dopant diffusion may occur in the second SSRW (n-well) region 222b during any heat treatment processes that may be performed during later phases of device manufacture. Accordingly, in some embodiments, ambient process conditions used during the epitaxial growth process 244 may be adjusted in such a manner that the semiconductor layer 216 may include two separate non-doped semiconductor material layers (not shown) separated by a diffusion-blocking semiconductor material layer (not shown), such as the carbon-doped silicon material layer 207 formed in the first semiconductor layer stack 223a. In this way, any potential diffusion of n-type dopants from the n-doped semiconductor layer 215 may be substantially blocked, thereby maintaining a substantially dopant-free channel region material layer near the upper surface 216s of the semiconductor material layer 216.

In some device applications, such as those wherein a high-k/metal gate (HK/MG) electrode of a PMOS transistor element may be formed above the second SSRW region 222b (see, e.g., FIG. 2N), it may sometimes be advantageous to form a work-function adjusting material layer, such as a silicon-germanium (SiGe) semiconductor material layer, along the upper surface of the region 222b. FIG. 2L schematically depicts a further illustrative embodiment of the present disclosure, wherein the topmost layer of the second semiconductor layer stack 223b that is formed in the second SSRW (n-well) region 222b may be, for example, a work-function adjusting material, such as a silicon-germanium semiconductor material layer 217. As shown in FIG. 2L, the semiconductor device 200 may be exposed to a further epitaxial growth process 244 so as to selectively form the silicon-germanium semiconductor material layer 217 in the opening 203b and on the exposed surface 216s (see, FIG. 2K) of the semiconductor material layer 216. In certain illustrative embodiments, the silicon-germanium semiconductor material layer 217 may contain at least 20% atomic weight of germanium, wherein in at least some embodiments, the germanium content may range as high as 35% atomic weight. Furthermore, in at least some embodiments, the silicon-germanium semiconductor material layer 217 may be a substantially dopant-free material layer, so that there are no dopants present in the channel region of any transistor elements formed in and above the second SSRW region 222b, such as the transistor element 250P shown in FIG. 2N.

In some embodiments, the ambient process conditions used to form the SiGe material layer 217 during the epitaxial growth process 245 may be adjusted from the parameters used during the previous epitaxial growth process 244 so as to include an appropriate amount of germanium precursors, as required. In at least one embodiment, the thickness 217t of the SiGe material layer 217 may be on the order of approximately 5-10 nm, although the thickness may be adjusted as required, depending on the overall device design parameters. Additionally, it should be appreciated that the total overall height of the second semiconductor layer stack 223b in the second SSRW region 222b may be adjusted as previously described so that the upper surface 217s of the SiGe material layer 217 is recessed in the opening 203b by the depth 203d.

FIG. 2M schematically illustrates the semiconductor device 200 shown in FIG. 2K during yet a further processing step, wherein an etch process 246 may be used to remove the hard mask layer 209 from above the device 200. In certain embodiments, the etch recipe of the etch process 246 may be adjusted so as to selectively remove the hard mask layer 209, which may be silicon nitride or silicon oxynitride and the like, from above the thermal oxide layer 203 as well as the semiconductor materials of the first semiconductor layer stack 223a. It should be understood that, as indicated in FIG. 2M, the etch process 246 may also be similarly performed on semiconductor devices 200 having a device configuration as shown in FIG. 2L, wherein an upper portion of the semiconductor layer 216 may include a silicon-germanium work-function adjusting material layer, such as the SiGe material layer 217.

FIG. 2N schematically depicts the various illustrative embodiments of the semiconductor device 200 disclosed herein after additional device processing steps have been performed so as to form an NMOS transistor element 250N in and above the first SSRW (p-well) region 222a and a PMOS transistor element 250P in and above the second SSRW (n-well) region 222b. It should be understood that when a transistor element is described herein as being formed "in and above" a well region, such a description is intended to refer to the transistor element as being made up of, among other things, some elements that are formed "in" the well region—such as, for example, source/drain/channel regions, and the like—as well as other elements that are formed "above" the well region—such as a gate electrode structure and/or sidewall spacers, and the like—as will be further described below.

As shown in FIG. 2N, each of the transistor elements 250N, 250P may include a gate electrode structure 255 that is formed above a channel region 251 in each of the respective first and second SSRW regions 222a, 222b. Furthermore, each transistor element 250N, 250P may also include sidewall spacer structures 254 that are formed on sidewalls of the gate electrode structures 255, which may be used during various stages of device processing to form source and drain regions 252 in the semiconductor layer stacks 223a and 223b of the first and second SSRW regions 222a and 222b, respectively. Additionally, in at least some embodiments, metal silicide contact regions 253 may be formed in the source and drain regions of each transistor element 250N, 250P.

In certain illustrative embodiments, the gate electrode structures 255 of each of the transistor elements 250N, 250P may be formed based on traditional polySiON gate architecture, e.g., using polysilicon gate electrodes and oxide/oxynitride gate insulation layers. In other embodiments, the transistor elements 250N, 250P may be formed based on more advanced HK/MG gate architecture, e.g., using high-k dielectric gate insulation layers and conductive metal gate electrodes. Moreover, depending on the desired processing scheme, the HK/MG gate architecture may be based on a gate first integration, a replacement gate (gate last) integration, or a hybrid gate last integration.

As shown in FIG. 2N, at least an upper portion 203e of the "excess" isolation material of the reverse STI structure 210r and/or of any surrounding thermal oxide layer 203 may be removed during the various etching and cleaning processes that may be performed during the device processing steps that are used to form the transistor elements 250N and 250P. Accordingly, in some embodiments, the depth 203d of the recess in which each of the transistor elements 250N and 250P are formed may be commensurately reduced, wherein however the problems associated with divot-related defects (see, e.g., FIGS. 1G-1I) may be substantially avoided. Furthermore, it should be appreciated by those of ordinary skill after a complete reading of the present disclosure that, and regardless of the type of gate architecture employed, the channel regions 251 of each transistor element 250N and 250P may be made up of a substantially dopant-free semiconductor material, such as silicon or silicon-germanium, due at least in part to the disclosed methods for forming the semiconductor layer stacks 223a and 223b of the respective super-steep retrograde well regions 222a and 222b.

As a result of the present subject matter, various methods are disclosed for forming reverse shallow trench isolation structures made up of thermal oxide materials that are more etch-resistant than at least some CVD deposited oxides, such as HDP and HARP/eHARP oxides, and which may thus help to avoid at least some of the etch-related defects associated with more traditional shallow trench isolation structures. Furthermore, methods for forming super-steep retrograde well regions in conjunction with reverse STI structures are also disclosed, which may also help to avoid at least some of device reliability problems, such as short channel effects, threshold voltage variations, high off-state leakage currents and the like, that may commonly be associated with more conventional halo-doped semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a thermal oxidation process to form a layer of thermal oxide material on a semiconductor layer of a semiconductor substrate;
    forming a first well region opening in said layer of thermal oxide material, wherein said first well region opening exposes a first surface region of said semiconductor layer;
    forming a first semiconductor device well region on said first exposed surface region;
    after forming said first semiconductor device well region on said first exposed surface region, forming a second well region opening in said layer of thermal oxide material, said second well region opening exposing a second surface region of said semiconductor layer, wherein forming said second well region opening comprises forming an isolation region between said second well region opening and said first semiconductor device well region, said isolation region comprising a portion of said layer of thermal oxide material;
    after forming said second well region opening and said isolation region, forming a second semiconductor device well region on said second exposed surface region; and
    exposing an uncovered upper surface of said isolation region to a process sequence for forming a semiconductor device in and above at least one of said first and second semiconductor device well regions.

2. The method of claim 1, wherein forming each of said first and second semiconductor device well regions comprises forming a plurality of semiconductor material layers.

3. The method of claim 1, further comprising forming a transistor element in and above at least one of said first and second semiconductor device well regions.

4. The method of claim 1, wherein forming each of said first and second semiconductor device well regions comprises performing at least one epitaxial growth process.

5. The method of claim 2, wherein forming said plurality of semiconductor material layers of at least one of said first and second semiconductor device well regions comprises forming at least one doped semiconductor material layer and forming at least one substantially dopant-free semiconductor material layer.

6. The method of claim 5, wherein one of said at least one doped semiconductor material layers is formed on said at least one of said first and second exposed surface regions of said semiconductor layer and one of said at least one substantially dopant-free semiconductor material layers is formed as a top layer of said plurality of semiconductor material layers of said at least one of said first and second semiconductor device well regions.

7. The method of claim 6, wherein said top layer of said plurality of semiconductor material layers of said at least one of said first and second semiconductor device well regions comprises a silicon-germanium material.

8. The method of claim 2, wherein forming said plurality of semiconductor material layers of at least one of said first and second semiconductor device well regions comprises forming at least one diffusion-blocking semiconductor material layer.

9. The method of claim 1, wherein forming each of said first and second well region openings in said layer of thermal oxide material comprises forming a respective patterned mask layer above said layer of thermal oxide material and performing at least one etch process.

10. The method of claim 2, wherein forming said first semiconductor device well region comprises forming a first plurality of semiconductor material layers and wherein forming said second semiconductor device well region comprises forming a second plurality of semiconductor material layers that is different than said first plurality of semiconductor material layers.

11. A method, comprising:
    forming a first opening in a thermal oxide material layer formed on a silicon-containing semiconductor material layer of a semiconductor substrate, said first opening exposing a surface of a first region of said silicon-containing semiconductor material layer;
    forming a first semiconductor layer stack comprising a first plurality of semiconductor material layers in said first opening and on said exposed surface of said first region;
    after forming said first semiconductor layer stack in said first opening and on said exposed surface of said first region, forming a second opening in said thermal oxide material layer, said second opening exposing a surface of a second region of said silicon-containing semiconductor material, wherein forming said first and second openings comprises forming an isolation region comprising a portion of said thermal oxide material layer between said first and second openings;
    after forming said isolation region, forming a second semiconductor layer stack comprising a second plurality of semiconductor material layers in said second opening and on said exposed surface of said second region, wherein said second semiconductor layer stack is different than said first semiconductor layer stack; and
    exposing an uncovered upper surface of said isolation region to a process sequence for forming a semiconductor device above at least one of said first and second semiconductor layer stacks.

12. The method of claim 11, wherein a top layer of said first plurality of semiconductor material layers comprises a first substantially dopant-free semiconductor material and a top layer of said second plurality of semiconductor material layer comprises a second substantially dopant-free semiconductor material.

13. The method of claim 12, wherein said first substantially dopant-free semiconductor material is substantially silicon and said second substantially dopant-free semiconductor material comprises silicon-germanium.

14. The method of claim 11, wherein said thermal oxide material layer is formed by exposing said silicon-containing semiconductor material to a thermal oxidation ambient.

15. The method of claim 11, wherein a first layer of said first semiconductor layer stack is formed on said surface of said first region and comprises a p-doped semiconductor material, and wherein a first layer of said second semiconductor layer stack is formed on said surface of said second region and comprises an n-doped semiconductor material.

16. The method of claim 11, further comprising forming a first transistor element in and above said first semiconductor layer stack and forming a second transistor element in and above said second semiconductor layer stack, said first and second transistor elements having different conductivity types.

17. The method of claim 11, wherein forming said first semiconductor layer stack comprises performing at least one first epitaxial growth process, and wherein forming said second semiconductor layer stack comprises performing at least one second epitaxial growth process.

18. The method of claim 17, further comprising forming a mask layer above said first semiconductor layer stack and using said mask layer as an epitaxial growth mask while forming said second semiconductor layer stack.

19. The method of claim 1, further comprising, prior to forming said second semiconductor device well region on said second exposed surface region, forming a hard mask layer above an upper surface of said first semiconductor device well region and thereafter using said hard mask layer as an epitaxial growth mask while forming said second semiconductor device well region.

* * * * *